(12) United States Patent
White et al.

(10) Patent No.: US 8,017,524 B2
(45) Date of Patent: Sep. 13, 2011

(54) STABLE, HIGH RATE SILICON SLURRY

(75) Inventors: Michael White, Oswego, IL (US);
Jeffrey Gilliland, Montgomery, IL (US);
Lamon Jones, Aurora, IL (US); Alicia Walters, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 687 days.

(21) Appl. No.: 12/126,739

(22) Filed: May 23, 2008

(65) Prior Publication Data

US 2009/0291559 A1    Nov. 26, 2009

(51) Int. Cl.
*C09K 3/14* (2006.01)

(52) U.S. Cl. .................. 438/692; 510/175; 51/308

(58) Field of Classification Search .................. 438/692; 510/175; 51/308; 252/79.1
See application file for complete search history.

(56) References Cited

U.S. PATENT DOCUMENTS

| | | | |
|---|---|---|---|
| 3,170,273 A | 2/1965 | Walsh et al. | |
| 4,169,337 A | 10/1979 | Payne | |
| 4,462,188 A | 7/1984 | Payne | |
| 4,588,421 A | 5/1986 | Payne | |
| 5,230,833 A | 7/1993 | Romberger et al. | |
| 5,571,373 A | 11/1996 | Krishna et al. | |
| 5,885,334 A | 3/1999 | Suzuki et al. | |
| 6,280,652 B1 | 8/2001 | Inoue et al. | |
| 6,852,009 B2 | 2/2005 | Kawase et al. | |
| 7,005,382 B2 | 2/2006 | Nishimoto et al. | |
| 7,052,522 B2 | 5/2006 | Takami | |
| 7,153,335 B2 | 12/2006 | Siddiqui et al. | |
| 7,204,865 B2 | 4/2007 | Yamada | |
| 2002/0151252 A1 | 10/2002 | Kawase et al. | |
| 2004/0127047 A1 | 7/2004 | Yamada et al. | |
| 2004/0132305 A1 | 7/2004 | Nishimoto et al. | |
| 2005/0204639 A1 | 9/2005 | Ishihara | |
| 2005/0205837 A1* | 9/2005 | Miwa | 252/79.1 |
| 2006/0042501 A1 | 3/2006 | Miyazaki | |
| 2007/0181851 A1 | 8/2007 | Yamada | |
| 2007/0269987 A1 | 11/2007 | Nakano et al. | |
| 2008/0148652 A1* | 6/2008 | Siddiqui et al. | 51/308 |
| 2009/0057661 A1* | 3/2009 | Siddiqui et al. | 257/42 |
| 2009/0057834 A1* | 3/2009 | Schlueter et al. | 257/613 |
| 2010/0025623 A1* | 2/2010 | Teramoto et al. | 252/79.1 |

FOREIGN PATENT DOCUMENTS

WO    2004/078410 A2    9/2004
WO    2007/130350 A1    11/2007

OTHER PUBLICATIONS

Choi et al., *Journal of The Electrochemical Society*, 151(3): G185-G189 (2004).
Yoshida et al. *Journal of Sol-Gel Science and Technology*, 43(1): 9-13 (2007).

* cited by examiner

*Primary Examiner* — Gregory Webb
(74) *Attorney, Agent, or Firm* — Thomas E. Omholt; Frank J. Koszyk; Steven D. Weseman

(57) ABSTRACT

The invention provides a chemical-mechanical polishing composition comprising wet-process silica, a stabilizer compound, a potassium salt, a secondary amine compound, and water. The invention further provides a method of polishing a substrate with the polishing composition.

25 Claims, No Drawings

STABLE, HIGH RATE SILICON SLURRY

BACKGROUND OF THE INVENTION

Silicon wafers used in electronic devices are typically prepared from a single crystal silicon ingot that is first sliced into thin wafers using a diamond saw and then ground to remove surface imperfections arising from the sawing process. The silicon wafers then typically require a final polishing step to provide surfaces having very low surface roughness before they are acceptable for use in electronic devices.

Current methods of performing final polishing of silicon wafers often employ polishing compositions containing silica as an abrasive in an aqueous carrier and further comprising additives such as amines or quaternary ammonium salts as polishing rate enhancers. However, conventional polishing compositions for silicon wafers generally require over 10 minutes of polishing in order to remove 10-20 microns of silica. Polishing compositions are desired that can be used to polish silicon more quickly to improve throughput and more effectively utilize production capacity.

In addition, it is desirable to ship polishing compositions as concentrates (e.g., to reduce shipping volume and weight), which concentrates are then diluted by the user prior to polishing. However, conventional silicon polishing compositions exhibit colloidal instability at high concentrations, leading to difficulties in the redispersion of abrasive particles on dilution. Thus, there remains an important need in the art for improved polishing compositions for silicon wafers.

BRIEF SUMMARY OF THE INVENTION

The invention provides a chemical-mechanical polishing composition comprising (a) wet-process silica, (b) about 0.01 wt. % to about 0.5 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl, (c) about 0.002 wt. % to about 0.2 wt. % of a potassium salt, (d) about 0.002 wt. % to about 0.2 wt. % of a secondary amine compound, and (e) water, wherein the polishing composition has a pH of about 9 to about 12.

The invention also provides a chemical-mechanical polishing composition comprising (a) about 5 wt. % to about 20 wt. % of wet-process silica, (b) about 1 wt. % to about 8 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl, (c) about 0.4 wt. % to about 4 wt. % of a potassium salt, (d) about 0.4 wt. % to about 4 wt. % of a secondary amine compound, and (e) water, wherein the polishing composition has a pH of about 9 to about 12, and wherein the average particle size of the silica in the polishing composition after storage at 45° C. for 10 days, $D_1$, and the initial average particle size of the silica in the polishing composition, $D_0$, satisfy the following equation: $D_1/D_0<1.5$.

The invention further provides a method of chemical-mechanically polishing a substrate, which method comprises (i) contacting a substrate with a polishing pad and a chemical-mechanical polishing system comprising (a) wet-process silica, (b) about 0.01 wt. % to about 0.5 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl, (c) about 0.002 wt. % to about 0.2 wt. % of a potassium salt, (d) about 0.002 wt. % to about 0.2 wt. % of a secondary amine compound, and (e) water, wherein the polishing composition has a pH of about 9 to about 12, (ii) moving the polishing component relative to the substrate, and (iii) abrading at least a portion of the substrate to polish the substrate.

DETAILED DESCRIPTION OF THE INVENTION

The invention provides a chemical-mechanical polishing composition and a method of chemically-mechanically polishing a substrate.

In a first embodiment, the polishing composition comprises, consists essentially of, or consists of (a) wet-process silica, (b) about 0.01 wt. % to about 0.5 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl, (c) about 0.002 wt. % to about 0.2 wt. % of a potassium salt, (d) about 0.002 wt. % to about 0.2 wt. % of a secondary amine compound, and (e) water, wherein the polishing composition has a pH of about 9 to about 12.

The polishing composition comprises wet-process silica. Wet-process silica is characterized as being prepared by the polymerization of soluble silica precursors from aqueous solutions thereof. Wet-process silica comprises particles that typically are non-aggregated, individually discrete particles, which generally are spherical or nearly spherical in shape, but can have other shapes (e.g., shapes with generally elliptical, square, or rectangular cross-sections). Such particles typically are structurally different from fumed (i.e., pyrogenic) silica, which particles are prepared via flame hydrolysis of volatile precursors and are chain-like structures of aggregated primary particles with higher fractal dimensions.

Suitable examples of wet-process silica include condensation-polymerized silica and base-stabilized colloidal silica. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such condensation-polymerized silica particles can be prepared in accordance with U.S. Pat. No. 5,230,833 or can be obtained as any of various commercially available products such as the Fuso PL-1, PL-1H, PL-1 SL, PL-2, PL-2L, PL-3, PL-3H, PL-3L, PL-5, PL-6L, PL-7, PL-7H, PL-10H, and PL-20 products, as well as other similar products available from DuPont, Bayer, Applied Research, Silbond, Clariant, and others.

Base-stabilized colloidal silica particles can be prepared, for example, from silicic acid derived from an alkali silicate solution having a pH of about 9 to about 11, wherein the silicate anions undergo polymerization to produce discrete silica particles having the desired average particle size in the form of an aqueous dispersion. The colloidal silica is stabilized by the presence of a base such as sodium hydroxide. Non-limiting examples of commercially available colloidal silica suitable for use in the invention include SNOWTEX™ products from Nissan Chemical, NEXSIL™ and NEXSIL A™ series products available from Nyacol Nanotechnologies, Inc., TX13112, TX11005, DVSTS006, 1034A, 1050, 2327, and 2329 products available from Nalco Chemical, the BINDZIL 50/80, 30/310, and 40/130 products from EKA Chemicals, and LEVASIL™ products available from H. C. Starck.

The wet-process silica abrasive particles typically have an average particle size (e.g., average particle diameter) of about 4 nm to about 200 nm. Preferably, the wet-process silica abrasive particles have an average particle size of about 20 nm to about 100 nm (e.g., about 40 nm to about 75 nm). In this regard, particle size refers to the diameter of the smallest sphere that encloses the particle.

The polishing composition typically comprises about 0.05 wt. % or more (e.g., about 0.1 wt. % or more, or about 0.5 wt. % or more) of wet-process silica. Preferably, the polishing composition comprises about 2 wt. % or less (e.g., about 1.5 wt. % or less, or about 1 wt. % or less) of wet-process silica. More preferably, the polishing composition comprises about 0.1 wt. % to about 2 wt. % of wet-process silica (e.g., about 0.5 wt. % to about 1.5 wt. %) of wet-process silica (referred to hereinafter as "silica").

The silica desirably is suspended in the polishing composition, more specifically in the water of the polishing composition. When the silica is suspended in the polishing composition, the silica preferably is colloidally stable. The term colloid refers to the suspension of silica particles in the water. Colloidal stability refers to the maintenance of that suspension over time. In the context of this invention, a silica is considered colloidally stable if, when a suspension of the silica in water is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the silica composition ([C] in terms of g/ml) is less than or equal to 0.5 (i.e., $\{[B]-[T]\}/[C]\leq 0.5$). The value of $[B]-[T]/[C]$ desirably is less than or equal to 0.3, and preferably is less than or equal to 0.1.

The polishing composition comprises a stabilizer compound, i.e., one or more stabilizer compounds. The stabilizer compound is believed to promote colloidal stability of the silica particles in the polishing composition. The stabilizer compound is selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl. The $C_1$-$C_6$ alkyl, a $C_7$-$C_{12}$ arylalkyl, or a $C_6$-$C_{10}$ aryl can be further substituted with one or more hydroxyl groups. As will be recognized by one of ordinary skill in the art, $R^1R^2R^3R^4N^+X^-$ is commonly referred to as an ammonium salt, $R^1R^2R^3R^4P^+X^-$ is commonly referred to as a phosphonium salt, and $R^1R^2R^3S^+X^-$ is commonly referred to as a sulfonium salt. Preferably, $R^1$, $R^2$, $R^3$, and $R^4$ are independently $C_1$-$C_6$ alkyl (e.g., $C_1$-$C_4$ alkyl, or $C_1$-$C_3$ alkyl, or $C_1$-$C_2$ alkyl, or methyl). When the stabilizer compound is an imidazolium salt, preferably the imidazolium salt is substituted at the 1- and 3-positions of the imidazole ring. When the stabilizer compound is a pyridinium salt, the pyridinium salt will have a $C_1$-$C_6$ alkyl group bonded to the pyridine ring nitrogen atom. The pyridine ring carbon atoms can be unsubstituted, or the pyridine ring carbon atoms can be further substituted at any position with one or more $C_1$-$C_6$ alkyl groups. The anion $X^-$ can be any suitable anion. Preferably, the anion $X^-$ will not react with any component of the polishing composition. Non-limiting examples of suitable anions $X^-$ include hydroxide, chloride, bromide, fluoride, nitrate, sulfate, hydrogen sulfate, methanesulfonate, methylsulfate (i.e., $CH_3OSO_3^-$), and the like. Non-limiting examples of suitable cationic components of the stabilizer compound include tetramethylammonium, tetraethylammonium, tetrapropylammonium, tetrabutylammonium, tetrapentylammonium, ethyltrimethylammonium, diethyldimethylammonium, tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, hydroxyethyltriphenylphosphonium, trimethylsulfonium, triethylsulfonium, 1-ethyl-3-methylimidazolium, 1-butyl-3-methylimidazolium, 1-benzyl-3-methylimidazolium, 1-hexyl-3-methylimidazolium, 1-ethyl-2,3-dimethylimidazolium, and 1-methylpyridinium.

The polishing composition typically comprises about 0.01 wt. % or more (e.g., about 0.1 wt. % or more, or about 0.2 wt. % or more) of the stabilizer compound. Preferably, the polishing composition comprises about 0.5 wt. % or less (e.g., about 0.4 wt. % or less, or about 0.35 wt. % or less) of the stabilizer compound. More preferably, the polishing composition comprises about 0.01 wt. % to about 0.5 wt. % (e.g., about 0.1 wt. % to about 0.4 wt. %, or about 0.2 wt. % to about 0.35 wt. %) of the stabilizer compound.

The polishing composition comprises a potassium salt, i.e., one or more potassium salts. The potassium salt can be any suitable potassium salt. Preferably, the potassium salt is potassium hydrogen carbonate, potassium carbonate, or a combination of potassium hydrogen carbonate and potassium carbonate.

The polishing composition typically comprises about 0.002 wt. % or more (e.g., about 0.02 wt. % or more, or about 0.05 wt. % or more) of the potassium salt. Preferably, the polishing composition comprises about 0.2 wt. % or less (e.g., about 0.15 wt. % or less, or about 0.10 wt. % or less) of the potassium salt. More preferably, the polishing composition comprises about 0.01 wt. % to about 0.2 wt. % (e.g., about 0.05 wt. % to about 0.15 wt. %) of the potassium salt.

The polishing composition comprises a secondary amine compound, i.e., one or more secondary amine compounds. Preferably, the secondary amine compound is piperazine. It will be appreciated that piperazine can exist in the form of a salt (e.g., an acid addition salt) and can exist as a mono- and di-acid addition salt thereof. Piperazine also exists as a solid hexahydrate compound.

The polishing composition typically comprises about 0.002 wt. % or more (e.g., about 0.02 wt. % or more, or about 0.05 wt. % or more) of secondary amine compound. Preferably, the polishing composition comprises about 0.2 wt. % or less (e.g., about 0.15 wt. % or less, or about 0.10 wt. % or less, or even or about 0.08 wt. % or less) of secondary amine compound. More preferably, the polishing composition comprises about 0.002 wt. % to about 0.2 wt. % (e.g., about 0.05 wt. % to about 0.15 wt. %) of secondary amine compound. When the secondary amine compound is piperazine, the amount of piperazine present in the polishing composition refers to the amount of piperazine as $C_4H_8N_2$ as provided by the particular piperazine compound (e.g., anhydrous piperazine, piperazine hydrate, piperazine hydrochloride, and the like) used to prepare the polishing composition.

The polishing composition has a pH of about 9 to about 12 (e.g., about 9 to 11, or about 9 to about 10, or about 10 to about 11, or about 10 to about 11, or about 11 to about 12). The polishing composition optionally comprises pH adjusting agents, for example ammonium hydroxide, potassium hydroxide, nitric acid, sulfuric acid, or phosphoric acid. The polishing composition optionally comprises pH buffering systems, for example a buffering system comprising sodium carbonate and sodium hydrogen carbonate. Many such pH buffering systems are well known in the art. If the polishing composition comprises pH adjusting agents and/or buffering systems, the polishing composition will contain a sufficient amount of pH adjusting agents and/or buffering systems to maintain the pH in the ranges set forth herein.

The polishing composition optionally comprises a chelating agent (e.g., a complexing agent). The chelating agent can be any suitable chelating agent or combination of chelating agents. Non-limiting examples of suitable chelating agents include ethylenediaminetetraacetic acid ("EDTA"), iminodiacetic acid, oxalic acid, citric acid, 4,5-dihydroxy-1,2-benzenedisulfonic acid, salicylhydroxamic acid, tetraethylene pentamine, tris(methylenephosphonic acid), 1-hydroxyethylidene-1,1-diphosphonic acid, nitrilotri(methylphosphonic acid), diethylenetriaminepentakis(methylenephosphonic acid), and 2-phosphonobutane-1,2,4-tricarboxylic acid.

The polishing composition typically comprises about 0.001 wt. % or more (e.g., about 0.01 wt. % or more, or about 0.02 wt. % or more) of the chelating agent. Preferably, the polishing composition comprises about 0.1 wt. % or less (e.g., about 0.09 wt. % or less, or about 0.08 wt. % or less) of the chelating agent. More preferably, the polishing composition comprises about 0.001 wt. % to about 0.1 wt. % (e.g., about 0.01 wt. % to about 0.09 wt. %, or about 0.02 wt. % to about 0.08 wt. %) of the chelating agent.

The polishing composition comprises water. The water is used to facilitate the application of the abrasive particles, the salt, and any other additives to the surface of a suitable substrate to be polished or planarized. Preferably, the water is deionized water.

The polishing composition optionally further comprises one or more other additives. Such additives include any suitable dispersing agent, such as, for example, homopolymers or random, block, or gradient acrylate copolymers comprising one or more acrylic monomers (e.g., polyacrylates, polymethacrylates, vinyl acrylates and styrene acrylates), combinations thereof, and salts thereof. Other suitable additives include biocides. The biocide can be any suitable biocide, for example, an isothiazolinone biocide.

In a second embodiment, the invention provides a chemical-mechanical polishing composition comprising, consisting essentially of, or consisting of (a) about 5 wt. % to about 20 wt. % wet-process silica, (b) about 1 wt. % to about 8 wt. % (e.g., about 1 wt. % to about 5 wt. %) of a stabilizer compound selected from the group consisting of $R^1R^2R^3R^4N^+X^-$, $R^1R^2R^3R^4P^+X^-$, $R^1R^2R^3S^+X^-$, wherein each of $R^1$, $R^2$, $R^3$, and $R^4$ independently $C_1$-$C_6$ alkyl, a $C_7$-$C_{12}$ arylalkyl, or $C_6$-$C_{10}$ aryl, (c) about 0.4 wt. % to about 4 wt. % (e.g., about 0.6 wt. % to about 3 wt. %, or about 0.75 wt. % to about 2 wt. %) of a potassium salt, (d) about 0.4 wt. % to about 4 wt. % (e.g., about 0.6 wt. % to about 3 wt. %, or about 0.75 wt. % to about 2 wt. %) of a secondary amine compound, and (e) water, wherein the polishing composition has a pH of about 9 to about 12, and wherein the average particle size of the silica in the polishing composition after storage at 45° C. for 10 days, $D_1$, and the initial average particle size of the silica in the polishing composition, $D_0$, satisfy the following equation: $D_1/D_0 \leq 1.5$. The wet-process silica, stabilizer compound, potassium salt, secondary amine compound, and optional chelating agent are as described herein for the first embodiment of the chemical-mechanical polishing composition of the invention.

Advantageously, the polishing composition of the second embodiment remains colloidally stable over time. Preferably, the average particle size of the silica in the polishing composition after storage at 45° C. for 10 days, $D_1$, and the initial average particle size of the silica in the polishing composition, $D_0$, satisfy the following equation: $D_1/D_0 \leq 1.5$ (e.g., $D_1/D_0 \leq 1.4$, or $D_1/D_0 \leq 1.3$, or $D_1/D_0 \leq 1.2$, or $D_1/D_0 \leq 1.1$, or even $D_1/D_0 \leq 1.0$). The particle size of the silica can be measured using any suitable technique, for example, using laser diffraction techniques. Suitable particle size measurement instruments are available from e.g., Malvern Instruments (Malvern, UK).

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica, stabilizer compound, secondary amine compound, potassium salt, optional chelating agent, etc.) as well as any combination of ingredients (e.g., silica, stabilizer compound, secondary amine compound, potassium salt, optional chelating agent, etc.).

It will be understood that any of the components of the polishing composition that are salts (e.g., the stabilizer compound, the potassium salt, and/or the chelating agent), when dissolved in the water of the polishing composition, can exist in dissociated form as cations and anions. The amounts of salts present in the polishing composition as recited herein will be understood to refer to the weight of the undissociated salt used in the preparation of the polishing composition. For example, the weight of the potassium salt (e.g., potassium hydrogen carbonate) refers to the amount of the potassium salt as provided by its empirical formula (e.g., $KHCO_3$).

For example, the stabilizer compound, secondary amine compound, potassium salt, and optional chelating agent can be dissolved in water by the addition of the stabilizer compound, secondary amine compound, potassium salt, and optional chelating agent to water in any order, or even simultaneously. The silica then can be added and dispersed by any method that is capable of dispersing the silica in the polishing composition. The polishing composition can be prepared prior to use, with one or more components, such as the secondary amine compound, added to the polishing composition shortly before use (e.g., within about 1 minute before use, or within about 1 hour before use, or within about 7 days before use). The pH can be adjusted at any suitable time, and is preferably adjusted prior to the addition of the silica to the polishing composition. The polishing composition also can be prepared by mixing the components at the surface of the substrate during the polishing operation.

The polishing composition of the second embodiment is suitable for use as a concentrate which is intended to be diluted with an appropriate amount of water prior to use. For example, the silica, stabilizer compound, secondary amine compound, potassium salt, and optional chelating agent can each be present in the concentrate in an amount that is about 2 times (e.g., about 5 times, about 10 times, or about 15 times, or about 20 times, or about 100 times, or even about 200 times) greater than the concentration recited above for each component so that, when the concentrate is diluted with an equal volume of water (e.g., 2 equal volumes water, 5 equal volumes of water, or 10 equal volumes of water, or 15 equal volumes of water, or 20 equal volumes of water, or 100 equal volumes of water, or 200 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the stabilizer compound, secondary amine compound, potassium salt, optional chelating agent, and other suitable additives are at least partially or fully dissolved in the concentrate, preferably fully dissolved in the concentrate.

The invention further provides a method of chemically-mechanically polishing a substrate with the polishing composition. The method comprises (i) contacting a substrate with a polishing pad and a chemical-mechanical polishing system comprising, consisting essentially of, or consisting of (a) wet-process silica, (b) about 0.01 wt. % to about 0.5 wt. % of a stabilizer compound selected from the group consisting of $R^1R^2R^3R^4N^+X^-$, $R^1R^2R^3R^4P^+X^-$, $R^1R^2R^3S^+X^-$, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl, (c) about 0.002 wt. % to about 0.2 wt. % of a potassium salt, (d) about 0.002 wt. % to about 0.2 wt. % of a secondary amine compound, and (e) water, wherein the polishing composition has a pH of about 9 to about 12, (ii) moving the polishing component relative to the substrate, and (iii) abrading at least a portion of the substrate to polish the substrate.

Although the polishing composition of the invention can be used to polish any substrate, the polishing composition is particularly useful in the polishing of a substrate comprising silicon, for example, silicon wafers used in the electronics industry. In this regard, the silicon can be undoped silicon, or it can be p-type silicon doped with boron or aluminum. In addition, the silicon can be polysilicon. The inventive polishing composition and method of use thereof is suitable for the final polishing of silicon wafers as produced from silicon single crystals by diamond sawing and rough grinding, as well as for edge polishing of silicon wafers and for use in the reclamation of silicon wafers by polishing.

Advantageously, silicon substrates polished using the inventive polishing method exhibit low surface roughness. Surface roughness ($R_a$), which is defined herein as the arithmetical mean of deviations from planarity, can be measured using any suitable technique. Suitable techniques include stylus profilometry and optical profilometry, using instruments available from, e.g., Veeco Instruments (Plainview, N.Y.), as well as atomic force microscopy. Typically, the inventive polishing method produces a surface roughness on silicon wafers of about 20 Å or less (e.g., about 14 Å or less, or about 12 Å or less, or about 10 Å or less, or even about 8 Å or less), when measured using an optical profilometer.

The polishing method of the invention is particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Hard polyurethane polishing pads are particularly useful in conjunction with the inventive polishing method.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing endpoint, i.e., the determination of when to terminate the polishing process with respect to a particular substrate.

The following examples further illustrate the invention but, of course, should not be construed as in any way limiting its scope.

The polishing conditions in Examples 1-4 were as follows: 100 rpm carrier speed, 93 rpm plated speed, 24.3 kPa (3.5 psi) downforce of the polishing pad on the substrate, 150 mL/min polishing composition flow rate, and use of a hard polyurethane polishing pad.

EXAMPLE 1

This example demonstrates the effect of the concentrations of a stabilizer compound, a secondary amine compound, and a potassium salt on the removal rate observed for silicon achievable by the polishing composition of the invention.

Sixteen similar substrates, which substrates comprised 102 cm (4 inch) silicon wafers, were polished with sixteen different polishing compositions (Polishing Compositions 1A-1P). All of the polishing compositions contained 0.937 wt. % base-stabilized colloidal silica and 0.0167 wt. % ethylenediaminetetraacetic acid in water, and had a pH of about 11. Polishing Compositions 1A-1P further comprised tetramethylammonium hydroxide (i.e., a stabilizer compound), piperazine (i.e., a secondary amine compound), and potassium hydrogen carbonate (i.e., a potassium salt) in amounts as set forth in Table 1.

Following polishing, the removal rates for silicon were determined for each of the polishing compositions, and the results are summarized in Table 1.

TABLE 1

| Polishing Composition | Wt. % Tetramethylammonium hydroxide | Wt. % Piperazine | Wt. % KHCO$_3$ | Silicon Removal Rate (Å/min) |
|---|---|---|---|---|
| 1A | 0.3125 | 0.125 | 0.125 | 6103* |
| 1B | 0.3125 | 0.125 | 0.1875 | 6102 |
| 1C | 0.1875 | 0 | 0.25 | 6053 |
| 1D | 0.3125 | 0.0625 | 0.125 | 6010 |
| 1E | 0.1875 | 0.25 | 0.25 | 5917 |
| 1F | 0.25 | 0.125 | 0.125 | 5837 |
| 1G | 0.375 | 0.125 | 0.125 | 5741 |
| 1H | 0.4375 | 0.25 | 0.25 | 5601 |
| 1I | 0.4375 | 0 | 0.25 | 5525 |
| 1J | 0.3125 | 0.1875 | 0.125 | 5512 |
| 1K | 0.3125 | 0.125 | 0.0625 | 5466 |
| 1L | 0.1875 | 0 | 0 | 5159 |
| 1M | 0.1875 | 0.25 | 0 | 4565 |

TABLE 1-continued

| Polishing Composition | Wt. % Tetramethylammonium hydroxide | Wt. % Piperazine | Wt. % KHCO$_3$ | Silicon Removal Rate (Å/min) |
|---|---|---|---|---|
| 1N | 0.4375 | 0.25 | 0 | 3917 |
| 1O | 0.4375 | 0 | 0 | 3778 |
| 1P | 0.3125 | 0.125 | 0.125 | 5972 |

*Average of four experiments

As is apparent from the results set forth in Table 1, Polishing Compositions 1L-1O, which did not contain any potassium hydrogen carbonate, exhibited silicon removal rates that were at least approximately 6% to 31% lower than Polishing Compositions 1A-1K and 1P, which all contained potassium hydrogen carbonate. Polishing Composition 1J, which contained 0.1875 wt. % piperazine, 0.3125 wt. % tetramethylammonium hydroxide, and 0.125 wt. % potassium hydrogen carbonate, exhibited a silicon removal rate that was approximately 8% lower than Polishing Composition 1D, which contained 0.0625 wt. % piperazine, 0.3125 wt. % tetramethylammonium hydroxide, and 0.125 wt. % potassium hydrogen carbonate. Polishing Compositions IL and 1O, which contained 0.1875 wt. % and 0.4375 wt. %, respectively, of tetramethylammonium hydroxide, and no piperazine or potassium hydrogen carbonate, exhibited silicon removal rates of approximately 13% and 33%, respectively, lower than the silicon removal rates exhibited by Polishing Compositions 1E and 1H, which contained 0.1875 wt. % and 0.4375 wt. %, respectively, of tetramethylammonium hydroxide, and 0.25 wt. % each of piperazine and potassium hydrogen carbonate.

EXAMPLE 2

This example demonstrates the effect of the stabilizer compound and pH on the removal rate observed for silicon achievable by the polishing composition of the invention.

Similar substrates, which substrates comprised 4 inch (102 cm) silicon wafers, were polished with five different polishing compositions (Polishing Compositions 2A-2E). All of the polishing compositions contained 0.937 wt. % base-stabilized colloidal silica, 625 ppm piperazine, 469 ppm potassium hydrogen carbonate, and 156 ppm ethylenediaminetetraacetic acid, in water. Polishing Composition 2A further comprised 2500 ppm tetramethylammonium hydroxide and had a pH of 10.95. Polishing Composition 2B further comprised 4223 ppm tetramethylammonium bromide and had a pH of 9.78. Polishing Composition 2C further comprised 4690 ppm tetramethylphosphonium bromide and had a pH of 9.8. Polishing Composition 2D further comprised 9794 ppm ethyltriphenylphosphonium bromide and had a pH of 9.11. Polishing Composition 2E further comprised 4792 ppm 1-ethyl-3-methylimidazolium chloride and had a pH of 9.92.

Following polishing, the removal rates for silicon were determined for each of the polishing compositions, and the results are summarized in Table 2.

TABLE 2

| Polishing Composition | Silicon Removal Rate (Å/min) |
|---|---|
| 2A | 7617* |
| 2B | 8031* |
| 2C | 8627** |

TABLE 2-continued

| Polishing Composition | Silicon Removal Rate (Å/min) |
|---|---|
| 2D | 1429** |
| 2E | 8434* |

*average of three experiments
**average of two experiments

As is apparent from the results set forth in Table 2, Polishing Composition 2B, which contained 4223 ppm of tetramethylammonium bromide, exhibited a silicon removal rate that was approximately 5.4% greater than the silicon removal rate exhibited by Polishing Composition 2A, which contained 2500 ppm of tetramethylammonium hydroxide. Polishing Composition 2C, which contained 4690 ppm tetramethylphosphonium bromide, exhibited a silicon removal rate that was approximately 7.4% greater than Polishing Composition 2B, which contained 4223 ppm of tetramethylammonium bromide. Polishing Composition 2D, which contained 9794 ppm of ethyltriphenylphosphonium bromide, exhibited a silicon removal rate that was approximately 81% lower than the silicon removal rate exhibited by Polishing Composition 2A. Polishing Composition 2E, which contained 4792 ppm of 1-ethyl-3-methylimidazolium chloride, exhibited a silicon removal rate that was approximately 11% higher than the silicon removal rate exhibited by Polishing Composition 2A.

EXAMPLE 3

This example demonstrates the effect of the type of silica on the removal rate observed for silicon achievable by the polishing composition of the invention.

Similar substrates comprising 4 inch (102 cm) silicon wafers, were polished with two different polishing compositions (Polishing Compositions 3A and 3B). All of the polishing compositions contained 625 ppm piperazine, 469 ppm potassium hydrogen carbonate, and 156 ppm ethylenediaminetetraacetic acid, in water. Polishing Composition 3A further contained 0.937 wt. % base-stabilized colloidal silica and had a pH of 11. Polishing Composition 3B further contained 0.937 wt. % fumed silica and had a pH of 12.

Following polishing, the removal rates (RR) for silicon were determined for each of the polishing compositions, and the results are summarized in Table 3.

TABLE 3

| Polishing Composition | Silica Type | Silicon Removal Rate (Å/min) |
|---|---|---|
| 3A | colloidal silica | 7617* |
| 3B | fumed silica | 5622** |

*average of three experiments
**average of two experiments

As is apparent from the results set forth in Table 3, Polishing Composition 3B, which contained fumed silica, exhibited a silicon removal rate that was approximately 74% of the silicon removal rate exhibited by Polishing Composition 3A, which contained base-stabilized colloidal silica.

EXAMPLE 4

This example compares the effect of the type of wet-process silica on the removal rate observed for silicon achievable by the polishing composition of the invention.

Similar substrates comprising 4 inch (102 cm) silicon wafers, were polished with two different polishing compositions (Polishing Compositions 3A and 3B). All of the polishing compositions contained 625 ppm piperazine, 469 ppm potassium hydrogen carbonate, and 156 ppm ethylenediaminetetraacetic acid, in water, at a pH of 11. Polishing Composition 4A further contained 0.937 wt. % base-stabilized colloidal silica (Nalco TX-13112). Polishing Composition 4B further contained 0.937 wt. % condensation-polymerized silica (Fuso PL-2) and had a pH of 12.

Following polishing, the removal rates (RR) for silicon were determined for each of the polishing compositions, and the results are summarized in Table 4.

TABLE 4

| Polishing Composition | Silica Type | Silicon Removal Rate (Å/min) |
|---|---|---|
| 4A | base-stabilized colloidal silica | 8982* |
| 4B | condensation-polymerized silica | 8469** |

*average of 4 experiments
**average of 19 experiments

As is apparent from the results set forth in Table 4, Polishing Composition 4B, which contained condensation-polymerized silica, exhibited a silicon removal rate that was approximately 94% of the silicon removal rate exhibited by Polishing Composition 4A, which contained base-stabilized colloidal silica.

EXAMPLE 5

This example demonstrates the effect of the stabilizer compound on the removal rate and surface roughness observed for silicon achievable by the polishing composition of the invention.

Six pairs of similar substrates comprising 4 inch (102 cm) silicon wafers, were polished with six different polishing compositions (Polishing Compositions 5A-5F). All of the polishing compositions contained 1 wt. % base-stabilized colloidal silica, 667 ppm piperazine, 500 ppm potassium hydrogen carbonate, and 167 ppm ethylenediaminetetraacetic acid, in water, at a pH of about 11. Polishing Composition 5A further contained 0.267 wt. % tetramethylammonium hydroxide. Polishing Composition 5B further contained 0.404 wt. % tetrapropylammonium hydroxide. Polishing Composition 5C further contained 0.594 wt. % tetrapropylammonium hydroxide. Polishing Composition 5D further contained 0.307 wt. % ethyltrimethylammonium hydroxide. Polishing Composition 5E further contained 0.348 wt. % ethyltrimethylammonium hydroxide. Polishing Composition 5F further contained 0.450 wt. % tetramethylammonium bromide.

Following polishing, the silicon removal rate was determined and the surface roughness ($R_a$) were determined. The average value for silicon removal rate and for $R_a$ are summarized in Table 5.

TABLE 5

| Polishing Composition | Silicon Removal Rate (Å/min) | $R_a$ (Å) |
|---|---|---|
| 5A | 7200 | 10.9 |
| 5B | 3850 | 7.5 |
| 5C | 4100 | 10.2 |
| 5D | 6300 | 11.0 |
| 5E | 6975 | 11.2 |
| 5F | 7600 | 11.3 |

As is apparent from the results set forth in Table 5, use of Polishing Composition 5B, which contained 0.267 wt. % tetrapropylammonium hydroxide, resulted in the lowest $R_a$ in polishing silicon wafers observed for any of the polishing compositions. Use of Polishing Composition 5C, which contained 0.594 wt. % tetrapropylammonium hydroxide, resulted in an $R_a$ that was approximately 36% greater than resulted from use of Polishing Composition 5B. Polishing Composition 5B exhibited a silicon removal rate that was approximately 49% the silicon removal rate exhibited by Polishing Composition 5F, which contained 0.450 wt. % tetramethylammonium bromide.

EXAMPLE 6

This example demonstrates the effect of silica particle size on the removal rate observed for silicon achievable by the polishing composition of the invention.

Five pairs of similar substrates comprising 10.2 cm (4 inch) silicon wafers, were polished with six different polishing compositions (Polishing Compositions 5A-5F). All of the polishing compositions contained 0.937 wt. % base-stabilized colloidal silica, 2500 ppm tetramethylammonium hydroxide, 625 ppm piperazine, 469 ppm potassium hydrogen carbonate, and 156 ppm ethylenediaminetetraacetic acid, in water, at a pH of about 11. Polishing Composition 6A contained silica with 65 nm average particle size. Polishing Composition 6B contained silica with 57 nm average particle size. Polishing Composition 6C contained silica with 24 nm average particle size. Polishing Composition 6D contained silica with 22 nm average particle size. Polishing Composition 6E contained silica with 167 nm average particle size.

Following polishing, the silicon removal rate and the surface roughness ($R_a$) were determined. The average values for silicon removal rate and for $R_a$ are summarized in Table 6.

TABLE 6

| Polishing Composition | Average Particle Size (nm) | Silicon Removal Rate (Å/min) | $R_a$ (Å) |
|---|---|---|---|
| 6A | 65 | 8056 | 7.88 |
| 6B | 57 | 8267 | 7.96 |
| 6C | 24 | 9046 | 8.42 |
| 6D | 22 | 9051 | 8.11 |
| 6E | 167 | 7043 | 8.25 |

As is apparent from the results set forth in Table 6, Polishing Composition 6E, which contained colloidal silica having an average particle size of 167 nm, exhibited a silicon removal rate that was approximately 87% of the silicon removal rate exhibited by Polishing Composition 6A, which contained colloidal silica having an average particle size of 65 nm. The use of Polishing Composition 6E resulted in an $R_a$ that was approximately 4.7% greater than resulted from use of Polishing Composition 6A. Polishing Composition 6C, which contained colloidal silica having an average particle size of 24 nm, exhibited a silicon removal rate that was approximately 12% greater than the silicon removal rate exhibited by Polishing Composition 6A. The use of Polishing Composition 6C resulted in an $R_a$ that was approximately 6.9% greater than resulted from use of Polishing Composition 6A.

EXAMPLE 7

This example demonstrates the stability of the concentrated polishing composition of the second embodiment as measured by change in silica particle size to storage at elevated temperature.

Eight different polishing compositions (Polishing Compositions 7A-7H) were prepared. The polishing compositions comprised 25 wt. % base-stabilized colloidal silica, tetramethylammonium hydroxide ("TMAH") (i.e., a stabilizer compound), piperazine (i.e., a secondary amine compound), potassium hydrogen carbonate ("KHCO$_3$") (i.e., a potassium salt), and 0.25% ethylenediaminetetraacetic acid in water, at a pH of about 11. The amounts of tetramethylammonium hydroxide, piperazine, and potassium hydrogen carbonate in each of the polishing compositions are set forth in Table 7.

The initial particle size ($D_0$) of the silica particles after preparation of Polishing Compositions 7A-7H and the particle size of the silica particles after storage of Polishing Compositions 7A-7H at 45° C. for 10 days ($D_1$) was measured using a particle size measuring instrument obtained from Malvern Instruments (Malvern, UK), and the results are summarized in Table 7.

TABLE 7

| Polishing Composition | TMAH (wt. %) | Piperazine (wt. %) | KHCO$_3$ (wt. %) | $D_0$ (nm) | $D_1$ (nm) | $D_1/D_0$ |
|---|---|---|---|---|---|---|
| 7A | 5 | 2 | 2 | 58.6 | 52.4 | 0.89 |
| 7B | 5 | 1 | 2 | 56.7 | 48.6 | 0.85 |
| 7C | 5 | 2 | 3 | 62.4 | 50.9 | 0.82 |
| 7D | 5 | 2 | 1 | 56.2 | 52.1 | 0.93 |
| 7E | 7 | 4 | 0 | 59.9 | 56.7 | 0.95 |
| 7F | 3 | 0 | 0 | 57.0 | 46.3 | 0.81 |
| 7G | 3 | 0 | 4 | 60.6 | gelled | N/A |
| 7H | 4 | 2 | 2 | 61.5 | gelled | N/A |

As is apparent from the data set forth in Table 7, Polishing Compositions 7A-7D, which contained wet process silica, a stabilizer compound, a potassium compound, and a secondary amine, did not exhibit an increase in particle size after storage at 45° C. for 10 days, even though Polishing Composition 7H, which also contained the aforementioned components in somewhat different percentages, exhibited gelling after storage at 45° C. for 10 days.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) wet-process silica,
   (b) about 0.01 wt. % to about 0.5 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl,
   (c) about 0.002 wt. % to about 0.2 wt. % of a potassium salt, wherein the potassium salt is potassium hydrogen carbonate, potassium carbonate, or a combination of potassium hydrogen carbonate and potassium carbonate,
   (d) about 0.002 wt. % to about 0.2 wt. % of a secondary amine compound,
   (e) water,
   wherein the polishing composition has a pH of about 9 to about 12.

2. The polishing composition of claim 1, wherein the wet-process silica is condensation-polymerized silica or base-stabilized colloidal silica.

3. The polishing composition of claim 1, wherein the polishing composition comprises about 0.05 to about 2 wt. % of silica.

4. The polishing composition of claim 1, wherein the stabilizer compound is $R^1R^2R^3R^4N^+X^-$, and each of $R^1$, $R^2$, $R^3$, and $R^4$ independently is a $C_1$-$C_6$ alkyl.

5. The polishing composition of claim 4, wherein the polishing composition comprises about 0.20 wt. % to about 0.35 wt. % of the stabilizer compound.

6. The polishing composition of claim 1, wherein the secondary amine compound is piperazine.

7. The polishing composition of claim 6, wherein the polishing composition comprises about 0.05 wt. % to about 0.15 wt. % of piperazine.

8. The polishing composition of claim 1, wherein the polishing composition comprises about 0.05 wt. % to about 0.15 wt. % of the potassium salt.

9. The polishing composition of claim 1, wherein the polishing composition further comprises about 0.001 wt. % to about 0.1 wt. % of a chelating agent.

10. A chemical-mechanical polishing composition comprising:
    (a) about 5 wt. % to about 20 wt. % of wet-process silica,
    (b) about 2 wt. % to about 8 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl,
    (c) about 0.4 wt. % to about 4 wt. % of a potassium salt, wherein the potassium salt is potassium hydrogen carbonate, potassium carbonate, or a combination of potassium hydrogen carbonate and potassium carbomate, (d) about 0.4 wt. % to about 4 wt. % of a secondary amine compound, and (e) water, wherein the polishing composition has a pH of about 9 to about 12, and wherein the average particle size of the silica in the polishing composition after storage at 45° C. for 10 days, $D_1$, and the initial average particle size of the silica in the polishing composition, $D_0$, satisfy the following equation: $D_1/D_0 \leqq 1.5$.

11. The polishing composition of claim 10, wherein the wet-process silica is condensation-polymerized silica or base-stabilized colloidal silica.

12. The polishing composition of claim 10, wherein the stabilizer compound is $R^1R^2R^3R^4N^+X^-$, and each of $R^1$, $R^2$, $R^3$, and $R^4$ independently is a $C_1$-$C_6$ alkyl.

13. The polishing composition of claim 10, wherein the secondary amine compound is piperazine.

14. The polishing composition of claim 10, wherein the polishing composition further comprises about 0.05 wt. % to about 1 wt. % of a chelating agent.

15. A method of chemical-mechanically polishing a substrate, which method comprises:

(i) contacting a substrate with a polishing pad and a chemical-mechanical polishing system comprising:

(a) wet-process silica, (b) about 0.01 wt. % to about 0.5 wt. % of a stabilizer compound selected from the group consisting of $R^1R^2R^3R^4N^+X^-$, $R^1R^2R^3R^4P^+X^-$, $R^1R^2R^3S^+X^-$, an imidazolium salt, and a pyridinium salt, wherein each of $R^1$, $R^2$, $R^3$, and $R^4$ independently is a $C_1$-$C_6$ alkyl, a $C_7$-$C_{12}$ arylalkyl, or a $C_6$-$C_{10}$ aryl, (c) about 0.002 wt. % to about 0.2 wt. % of a potassium salt, wherein the potassium salt is potassium gydrogen carbonate, potassium carbonate, or a combination or potassium hydrogen carbonate and potassium carbonate.

(d) about 0.002 wt. % to about 0.2 wt. % of a secondary amine compound, (e) water, wherein the polishing composition has a pH of about 9 to about 12

(ii) moving the polishing component relative to the substrate, and (iii) abrading at least a portion of the substrate to polish the substrate.

16. The method of claim 15, wherein the wet-process silica is condensation-polymerized silica or base-stabilized colloidal silica.

17. The method of claim 15, wherein the polishing composition comprises about 0.05 to about 2 wt. % of silica.

18. The method of claim 15, wherein the stabilizer compound is $R^1R^2R^3R^4N^+X^-$, and each of $R^1$, $R^2$, $R^3$, and $R^4$ independently is a $C_1$-$C_6$ alkyl.

19. The method of claim 18, wherein the polishing composition comprises about 0.20 wt. % to about 0.35 wt. % of the stabilizer compound.

20. The method of claim 15, wherein the secondary amine compound is piperazine.

21. The method of claim 20, wherein the polishing composition comprises about 0.002 wt. % to about 0.15 wt. % of piperazine.

22. The method of claim 15, wherein the polishing composition comprises about 0.002 wt. % to about 0.15 wt. % of the potassium salt.

23. The method of claim 15, wherein the polishing composition further comprises about 0.001 wt. % to about 0.1 wt. % of a chelating agent.

24. The method of claim 15, wherein the substrates comprises silicon, and a portion of the silicon is abraded to polish the substrate.

25. The method of claim 24, wherein the silicon is p+ doped silicon.

* * * * *